United States Patent
Nam et al.

(10) Patent No.: US 8,907,391 B2
(45) Date of Patent: Dec. 9, 2014

(54) SEMICONDUCTOR DEVICE AND METHOD OF MANUFACTURING THE SEMICONDUCTOR DEVICE

(75) Inventors: Jung-Soo Nam, Seoul (KR); Joon-Suk Oh, Seoul (KR); Hye-Young Park, Youngin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/614,654

(22) Filed: Sep. 13, 2012

(65) Prior Publication Data

US 2013/0161711 A1 Jun. 27, 2013

(51) Int. Cl.
*H01L 29/94* (2006.01)
*H01L 29/78* (2006.01)

(52) U.S. Cl.
USPC ............ 257/296; 257/288; 257/E29.255; 257/E29.345

(58) Field of Classification Search
USPC ............................ 257/299, 379, E29.345
See application file for complete search history.

(56) References Cited

U.S. PATENT DOCUMENTS

| | | | | |
|---|---|---|---|---|
| 2007/0122953 A1* | 5/2007 | Liu et al. | ....... | 438/187 |
| 2008/0224228 A1* | 9/2008 | Teo et al. | ....... | 257/379 |
| 2008/0237673 A1* | 10/2008 | Wada et al. | ....... | 257/299 |
| 2009/0057735 A1* | 3/2009 | Beak et al. | ....... | 257/292 |

FOREIGN PATENT DOCUMENTS

| | | |
|---|---|---|
| JP | 11-068058 | 9/1999 |
| KR | 1020080076093 | 8/2008 |
| KR | 1020080100950 | 11/2008 |

\* cited by examiner

*Primary Examiner* — Fernando L Toledo
*Assistant Examiner* — Lawrence-Linh T Nguyen
(74) *Attorney, Agent, or Firm* — Ellsworth IP Group PLLC

(57) ABSTRACT

A semiconductor device includes a substrate including an active region having an isolated shape and a field region. A gate insulation layer is provided on an upper surface of the active region of the substrate. A gate electrode is provided on the gate insulation layer and spaced apart from the boundary of the active region to cover the middle portion of the active region. An impurity region is provided under a surface of the active region that is exposed by the gate electrode.

20 Claims, 19 Drawing Sheets

SECOND REGION | FIRST REGION | SECOND REGION

SEMICONDUCTOR DEVICE AND METHOD OF MANUFACTURING THE SEMICONDUCTOR DEVICE

CROSS-REFERENCE TO RELATED APPLICATIONS

This application claims priority under 35 U.S.C. §119 from Korean Patent Application No. 2011-140228, filed on Dec. 22, 2011 in the Korean Intellectual Property Office (KIPO), the entire contents of which are herein incorporated by reference.

BACKGROUND

1. Field

The present general inventive concept relates to a semiconductor device and a method of manufacturing the semiconductor device. More particularly, the present general inventive concept relates to a MOS capacitor having a large capacitance, a semiconductor device including the MOS capacitor, and a method of manufacturing the semiconductor device.

2. Description of the Related Art

Recently, according to high integration and large capacitance of a semiconductor device, an exterior component may be embedded therein. For example, in a case of a mobile display driving chip, a high-capacitance MOS capacitor for a decoupling capacitor or a boosting circuit may be embedded therein. The MOS capacitor may be required to have a high reliability and excellent electrical characteristics.

SUMMARY

The present general inventive concept provides semiconductor devices having a structure capable of preventing damage by plasma.

The present general inventive concept also provides methods of manufacturing the semiconductor device.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a semiconductor device including a substrate including an active region having an isolated shape and a field region, a gate insulation layer provided on an upper surface of the active region of the substrate, a gate electrode provided on the gate insulation layer and spaced apart from the boundary of the active region to cover the middle portion of the active region, and an impurity region provided under a surface of the active region that is exposed by the gate electrode.

In example embodiments, the impurity region may have an annular shape extending along the boundary of the gate electrode.

In example embodiments, the semiconductor device may be used as a MOS capacitor. The MOS capacitor may have an operation voltage of 3V to 7V.

In example embodiments, the gate insulation layer may have an equivalent oxide thickness of 50 Å to 200 Å.

In example embodiments, an isolation trench may be provided in the field region of the substrate and an isolation layer pattern may be provided within the isolation trench.

In example embodiments, the upper surface of the active region may include a first portion having a flat surface and a second portion having an angle of inclination in the boundary region adjacent to the field region.

In example embodiments, the gate insulation layer may have a relatively smaller thickness on the second portion of the active region than on the first portion of the active region.

In example embodiments, the semiconductor device may further include an insulation interlayer provided on the substrate to cover the gate electrode, first contact plugs penetrating the insulation interlayer to make contact with the impurity region, and second contact plugs electrically connected to the gate electrode.

In example embodiments, the first and second contact plugs may include a metal material.

In example embodiments, the semiconductor device may further include MOS transistors in another region of the substrate, such that MOS transistor may include a second gate insulation layer, a second gate electrode having a line width smaller than that of the gate electrode and extending across the active region and a second impurity region provided under a surface of the active region in both sides of the second gate electrode.

The gate electrode may be spaced apart from the boundary of the active region by 20 nm or more.

The foregoing and/or other features and utilities of the present general inventive concept may also be achieved by providing a method of manufacturing a semiconductor device, including performing an isolation process on a substrate to form an active region and a field region, forming a gate insulation layer on an upper surface of the active region of the substrate, forming a gate electrode on the gate insulation layer, such that the gate electrode is spaced apart from the boundary of the active region to cover the middle portion of the active region, and forming an impurity region under a surface of the active region that is exposed by the gate electrode.

In example embodiments, the gate insulation layer may have an equivalent oxide thickness of 50 Å to 200 Å.

In example embodiments, in order to perform the isolation process, the substrate may be partially etched to form an isolation trench, and an isolation layer pattern may be formed within the isolation trench.

The foregoing and/or other features and utilities of the present general inventive concept may also be achieved by providing a semiconductor device, including a substrate including an active region formed in a field region, a gate electrode formed over a center portion of the active region, an impurity region formed in the active region at portions exposed by the gate electrode, and a gate insulation layer formed between the gate electrode and the active region to cover the active region and the impurity region.

The respective end portions of the gate insulation layer may extend to respective outer portions of the impurity region.

The gate insulation layer may include a middle portion of uniform thickness, and a plurality of end portions having a decreasing thickness with respect to the middle portion.

An upper surface of the active region may include a first portion having a flat surface corresponding to the middle portion of the gate insulation layer and a second portion having an angle of inclination corresponding to the end portion of the gate insulation layer.

The foregoing and/or other features and utilities of the present general inventive concept may also be achieved by providing a semiconductor device, including a substrate including a plurality of active regions, a capacitor region, including a first impurity region adjacent to a first of the plurality of active regions, a first gate insulation layer disposed on an upper surface of the first of the plurality of active regions and the first impurity region, and a first gate electrode disposed on an upper surface of the first gate insulation layer and within a center portion of the first of the plurality of active regions.

The semiconductor device may further include a transistor region, including a second impurity region adjacent to a second of the plurality of active regions, a second gate insulation layer disposed on an upper surface of the second of the plurality of active regions and the second impurity region, and a second gate electrode disposed on an upper surface of the second gate insulation layer and within a center portion of the second of the plurality of active regions.

The capacitor region may further include a third impurity region adjacent to a third of the plurality of active regions, a third gate insulation layer disposed on an upper surface of the third of the plurality of active regions and the third impurity region, and another first gate electrode disposed on the upper surface of the third gate insulation layer and within a center portion of the third of the plurality of active regions.

The first impurity region may be N-type doped and the third impurity region may be P-type doped.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
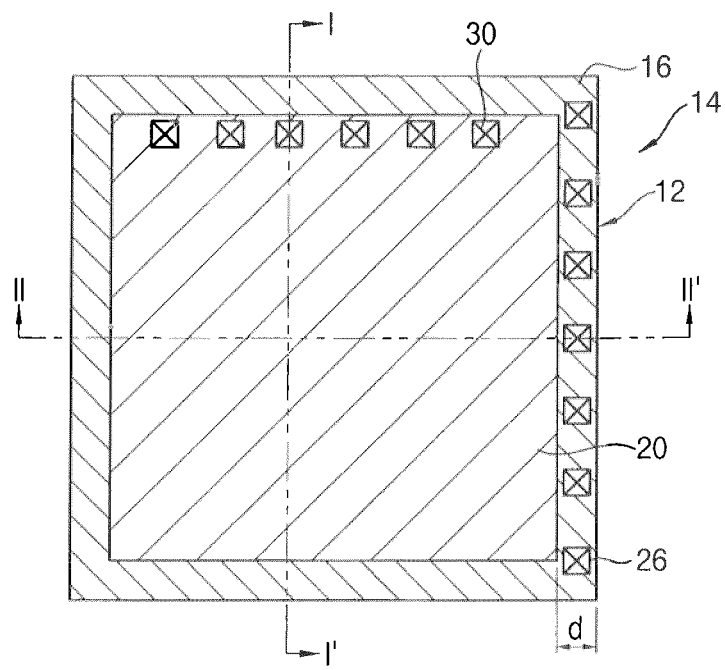
FIG. 1 is a plan view illustrating a MOS capacitor in accordance with a first example embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant at and will not be interpreted in an idealized or overly formal sense unless expressly so defined herein.

Hereinafter, example embodiments will be explained in detail with reference to the accompanying drawings.

Embodiment 1

Figure 2A:
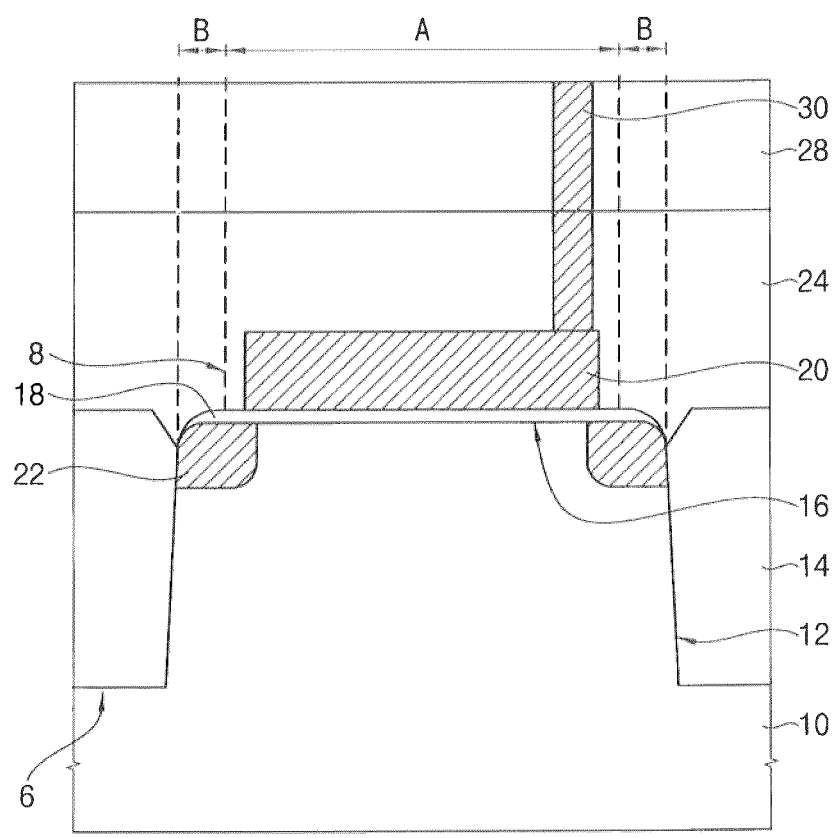
FIG. 2A is a cross-sectional view taken along the line I-I' in FIG. 1.
Figure 2B:
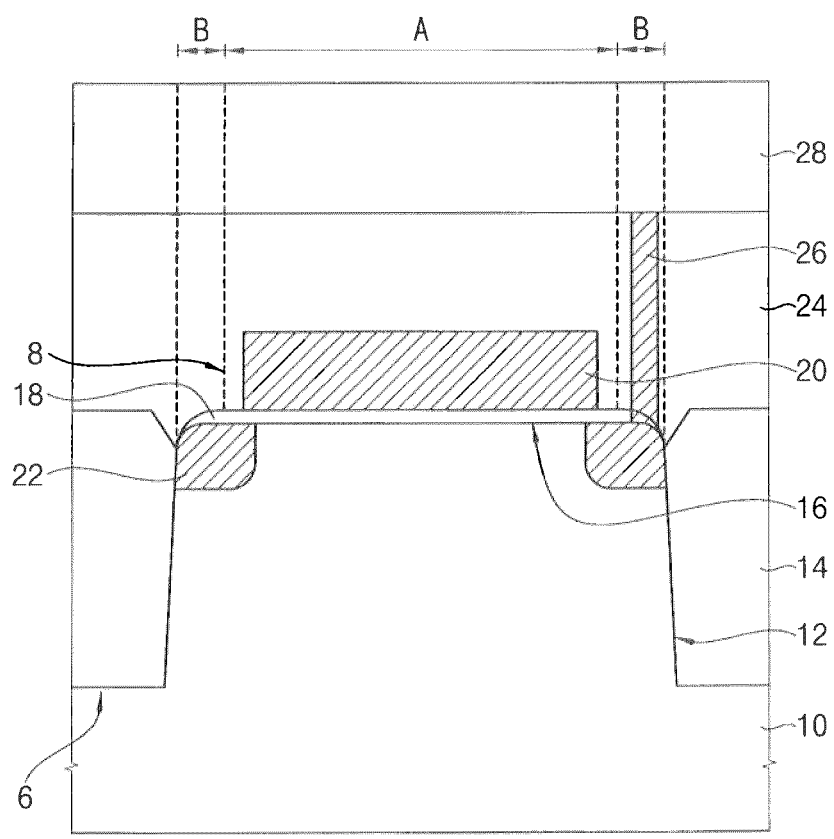
FIG. 2B is a cross-sectional view taken along the line II-II' in FIG. 1.
Figure 3:
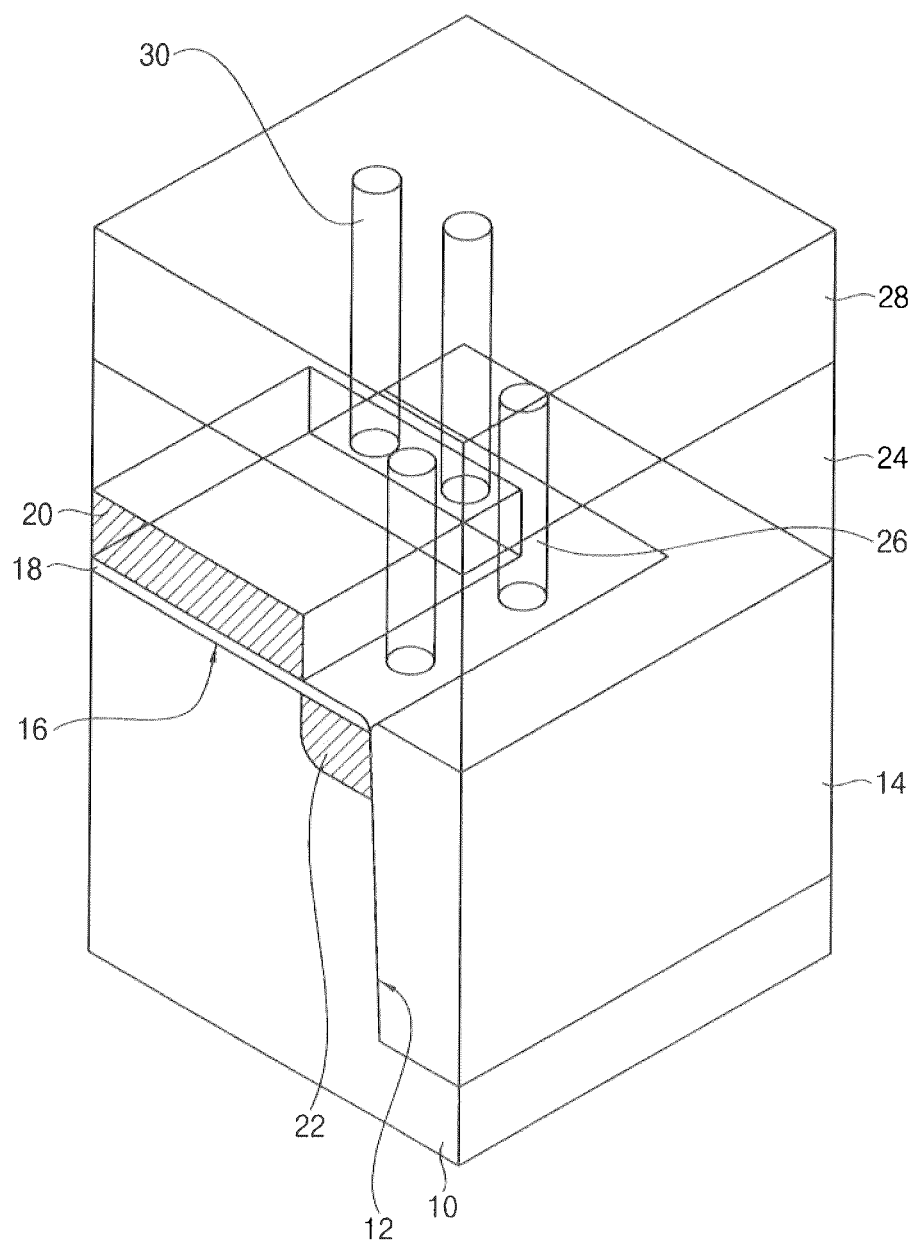
FIG. 3 is a perspective view illustrating the MOS capacitor in FIG. 1.

FIG. 1 is a plan view illustrating a metal-oxide semiconductor (MOS) capacitor in accordance with an example embodiment. FIG. 2A is a cross-sectional view taken along the line I-I' in FIG. 1. FIG. 2B is a cross-sectional view taken along the line II-II' in FIG. 1. FIG. 3 is a perspective view illustrating the MOS capacitor in FIG. 1.

When processes having high density plasma are performed, a strong electric field may be generated between a substrate and a gate electrode that may cause serious damage to a gate insulation layer. The MOS capacitor of FIG. 1 may have a structure capable of preventing the damage to the gate insulation layer due to an effect of the high density plasma.

Referring to FIGS. 1 through 3, a MOS capacitor 50 may include a gate structure 8 formed on a substrate 10, an impurity region 22, a first insulation interlayer 24, a second insulation interlayer 28, and connection wirings 26 and 30.

The substrate 10 may include a semiconductor material such as single-crystalline silicon, but is not limited thereto. The substrate 10 may include a field region 6 and an active region 16.

An isolation trench 12 may be formed in the field region 6 of the substrate 10. A sidewall of the isolation trench 12 may have a first angle of inclination with respect to a flat surface of the active region 16. An upper surface of the active region 16 adjacent to the isolation trench 12 may have a rounded shape, and thus, a boundary of the upper surface of the active region 16 may have a second angle of inclination smaller than the first angle of inclination. Accordingly, the upper surface of the active region 16 may include a first portion (A) having a relatively flat surface and a second portion (B) having a relatively gentle angle of inclination in the boundary region adjacent to the isolation trench 12.

An isolation layer pattern 14 may be provided in the isolation trench 12. The isolation layer pattern 14 may include silicon oxide. The active region 16 may have an isolated shape. A MOS capacitor may be arranged in the isolated active region 16.

The gate structure 8 may be provided on the active region 16. The gate structure 8 may have a stacked structure of a gate insulation layer 18 and a gate electrode 20.

The gate insulation layer 18 may include silicon oxide. The gate insulation layer 18 may have a first thickness on the first portion (A) of the active region 16 having a relatively flat surface and a second thickness smaller than the first thickness on the second portion (B) of the active region 16 having a relatively gentle angle of inclination.

As mentioned above, the MOS capacitor 50 may be optimized to prevent charging damage due to plasma.

When an equivalent oxide thickness of the gate insulation layer of the MOS capacitor 50 is over 200 angstroms (Å), the thickness of the gate insulation layer 18 may be relatively great so that the damage due to plasma may be insignificant to the gate insulation layer 18, thereby protecting the substrate 10. When an equivalent oxide thickness of the gate insulation layer 18 is less than 50 Å, most charges may penetrate the gate insulation layer 18 to move into the substrate 10 so that the damage due to plasma may be insignificant to the gate insulation layer 18. On the other hand, when the gate insulation layer 18 of the MOS capacitor 50 has an equivalent oxide thickness of 50 Å to 200 Å, charges generated by plasma may cause damage to the gate insulation layer 18 so that the gate insulation layer 18 may break down or a leakage current may occur. Further, when the MOS capacitor 50 has an operation voltage of about 3V to 7V, the damage due to plasma may become more significant.

Thus, when the gate insulation layer 18 of the MOS capacitor 50 has an equivalent oxide thickness of 50 Å to 200 Å and an operation voltage of the MOS capacitor 50 ranges between about 3V to 7V, the MOS capacitor 50 may be most vulnerable to charges due to plasma. Therefore, the MOS capacitor 50 of the present embodiment may be more effective when the gate insulation layer 18 has an equivalent oxide thickness of 50 Å to 200 Å and an operation voltage ranges between about 3V to 7V.

The gate electrode 20 may be provided on the gate insulation layer 18 and may be arranged corresponding to the isolated active region 16. In order to increase a capacitance of the MOS capacitor 50, the gate electrode 20 may need to have a relatively wide surface area. When an upper surface of the gate electrode 20 has a rectangular shape, the width of the upper surface of the gate electrode 20 may be several micrometers (or several tens of micrometers) wide. Because the upper surface of the gate electrode 20 has a relatively wide surface area, the surface area of a conductor exposed by plasma may be relatively wide. Accordingly, the conductor may serve as an antenna for a current collector. As the surface area of the antenna is increased, damage by plasma may also be increased.

The gate electrode 20 may be formed not to extend to outer boundaries of the active region 16. That is, the gate electrode 20 may be formed to be within the boundaries of the active region 16. As such, the gate electrode 20 may cover a middle portion of the active region 16, while not covering the entirety of the active region 16. Accordingly, the gate electrode 20 may not overlap the isolation layer pattern 14.

As illustrated in FIG. 1, in order to decrease charging damage by plasma, the gate electrode 20 may be formed to be spaced apart from the boundaries of the isolation layer pattern 14 by 20 nm or more (d). The gate electrode 20 may be formed within the first portion (A) corresponding to a flat surface of the active region 16.

When the gate electrode 20 does not overlap the second portion (B) of the active region 16, the portion of the gate insulation layer 18 that has a relatively small thickness within the second portion (B) may not function as an effective gate insulation layer in an operation of a MOS capacitor. Accordingly, other portions of the gate insulation layer 18 that function as an effective gate insulation layer may have an entirely uniform thickness.

The gate electrode 20 may include at least one of polysilicon, metal silicide, metal, etc., but is not limited thereto. The gate electrode 20 may have a single-layered structure or a multi-layered structure.

As mentioned above, the gate electrode 20 may be formed not to overlap the isolation layer pattern 14, to thereby prevent charging damage due to high density plasma. Hereinafter, decreasing charging damages according to a relative position between the isolation layer pattern 14 and the gate electrode 20 will be explained in detail.

The impurity region 22 may be provided under the surface of the active region 16 that is exposed by the gate electrode 20. Based on a conductive type of the MOS capacitor 50, the impurity region 22 may be doped with N-type impurities or P-type impurities.

The gate electrode 20 may not extend across the entirety of the active region 16. The impurity region 22 may not be separated by the gate electrode 20 to form a ring. Therefore, the impurity region 22 may have an annular shape extending along four sides of the gate electrode 20.

The first insulation interlayer 24 may be provided on the substrate 10 to cover the gate electrode 20. The first insulation interlayer 24 may include silicon oxide, but is not limited thereto.

The connection wirings 26 and 30 may include a first contact plug 26 and a second contact plug 30.

The first contact plug 26 may penetrate the first insulation interlayer 24 to make contact with the impurity region 22. The first contact plug 26 may include a barrier metal layer pattern and a metal layer pattern.

The second contact plug 30 may penetrate the second insulation interlayer 28 to make contact with the gate electrode 20. A plurality of the first contact plugs 26 may be arranged in a row.

The second contact plug 30 may be provided on a periphery region of the upper surface of the gate electrode 20. A plurality of the second contact plugs 30 may be arranged in a row.

Although it is not illustrated, a first wiring line may be provided to be electrically connected to the first contact plug 26 and a second wiring line may be provided to be electrically connected to the second contact plug 30.

The boundary regions between the isolation layer pattern 14 and the active region 16 may have a tip shape such that an electric field is focused on the boundary regions. For example, while deposition and etching processes are performed using plasma, a strong electric field may be focused on the boundary regions having the tip shape between the isolation layer pattern 14 and the active region 16. Further, the gate insulation layer 18 may have a relatively smaller thickness within the second portion (B) of the active region 16 adjacent to the isolation layer pattern 14. Therefore, the gate insulation layer 18 disposed on the second portion (B) of the active region 16 may be damaged more severely than other portions, such as the first portion A, by the strong electric filed generated during a plasma process.

Referring to FIGS. 2A and 2B, the gate electrode 20 may not overlap the isolation layer pattern 14. That is, the portion of the gate insulation layer 18 adjacent to the boundary of the isolation layer pattern 14 on which a strong electric field is focused, may not serve as a gate insulation layer in an operation of a MOS capacitor. Accordingly, the MOS capacitor 50 may be prevented from being damaged by a strong electric field generated during a plasma process.

Further, the gate insulation layer 18 formed on the second portion (B) of the active region 16 may not serve as an effective gate insulation layer of the MOS capacitor 50. Accordingly, the gate insulation layer 18 may have a substantially uniform thickness over the entire active region 16. Thus, the gate insulation layer 18 adjacent to the periphery region of the gate electrode 20 may not have a relatively smaller thickness, to thereby provide the MOS capacitor 50 having a high reliability and excellent electrical characteristics.

FIGS. 4 through 7 are cross-sectional views illustrating a method of manufacturing the MOS capacitor 50 as illustrated in FIG. 1.

Figure 4:
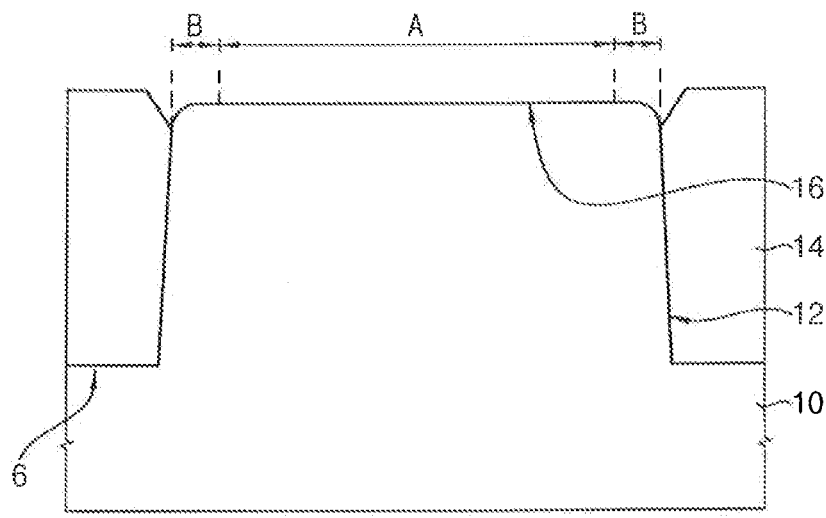
FIGS. 4 to 7 are cross-sectional views illustrating a method of manufacturing the MOS capacitor in FIG. 1.

Referring to FIG. 4, a field region 6 of a substrate 10 may be selectively etched to form an isolation trench 12. The isolation trench 12 may be filled up with an insulation material including silicon oxide to form an isolation layer pattern 14. A sidewall of the isolation trench 12 and an upper surface of the active region 16 may form a first angle of inclination. The upper surface of the active region 16 adjacent to the isolation trench 12 may have a rounded shape, and thus, a boundary of the upper surface of the active region 16 may have a second angle of inclination smaller than the first angle of inclination. Accordingly, the upper surface of the active region 16 may include a first portion (A) having a relatively flat surface and a second portion (B) having a relatively gentle angle of inclination in the boundary region adjacent to the isolation trench 12.

Figure 5:
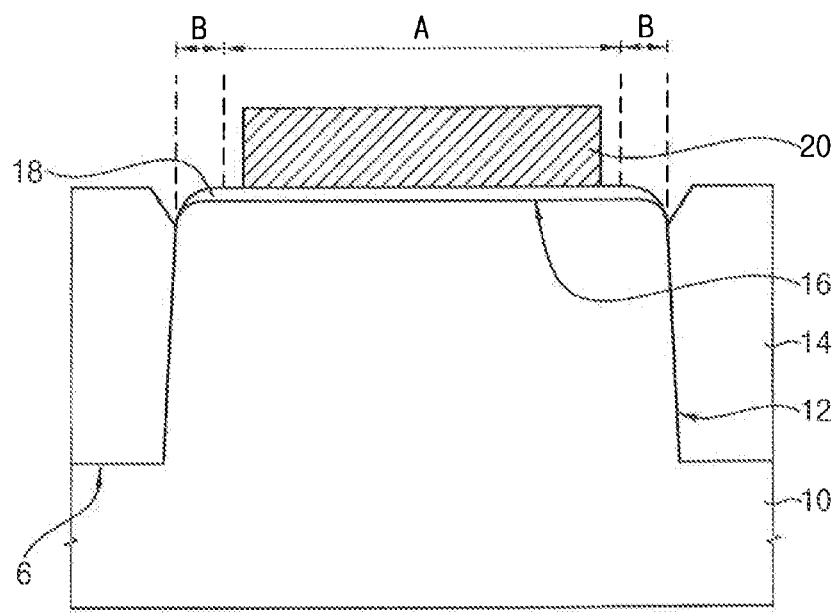

Referring to FIG. 5, a gate insulation layer 18 may be formed on the active region 16 of the substrate 10. The gate insulation layer 18 may be formed by a thermal oxidation process. The gate insulation layer 18 may include silicon oxide. The gate insulation layer 18 may be formed to have an equivalent oxide thickness of 50 Å to 200 Å. When the gate insulation layer 18 is formed by a thermal oxidation process the second portion (B) of the active region 16 adjacent to the isolation layer pattern 14 may have a relative smaller thickness.

A gate electrode layer (not illustrated) may be formed on the gate insulation layer 18. The gate electrode layer may include polysilicon, metal silicide, metal, etc., but is not limited thereto. The gate electrode layer may be formed to have a single-layered structure or a multi-layered structure.

A hard mask pattern (not illustrated) may be formed on the gate electrode layer, and then, the gate electrode layer may be patterned using the hard mask pattern an etching mask, to form a gate electrode 20.

The gate electrode 20 may be formed not to extend to the boundaries of the active region 16. The gate electrode 20 may be formed within the boundaries of the active region 16. That is, the gate electrode 20 may not overlap the isolation layer pattern 14.

For example, when the distance between the gate electrode 20 and the isolation layer pattern 14 is 20 nm or less, the gate electrode may be damaged while performing a following plasma process such as a plasma deposition process or a plasma etching process. Therefore, the gate electrode may be formed to be spaced apart from the isolation layer pattern by 20 nm or more. Additionally, the gate electrode 20 may be formed on the first portion having a flat surface of the active region 16.

Figure 6:
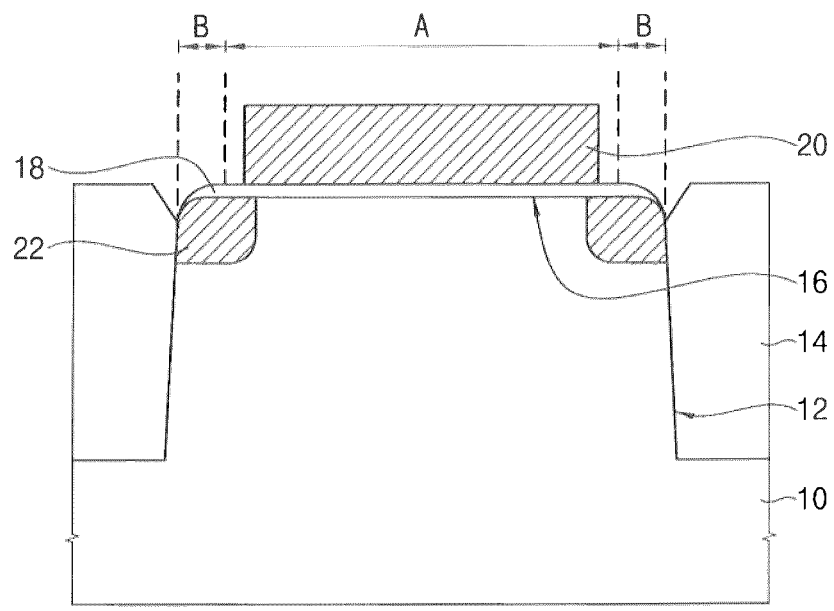

Referring to FIG. 6, impurities may be implanted into the substrate including the gate electrode 20 formed thereon to form an impurity region 22. The impurity region 22 may be formed along respective sides of the gate electrode 20 to form a ring. When the gate electrode 22 is formed using polysilicon, the impurities may be implanted into the substrate as well as the gate electrode 20.

Figure 7:
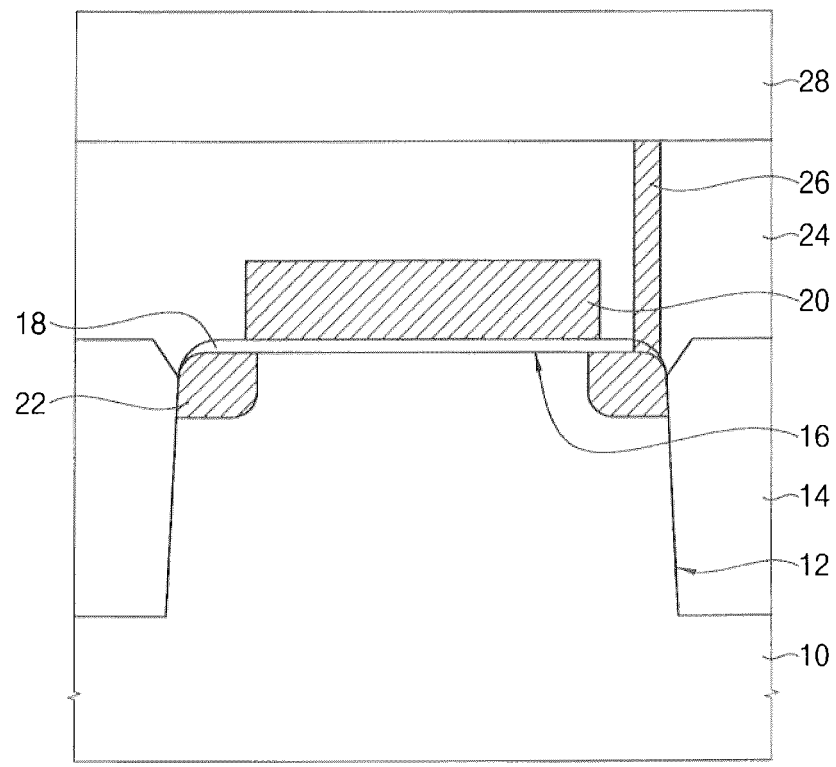

Referring to FIG. 7, a first insulation interlayer 24 may be formed to cover the gate electrode 20. The first insulation interlayer 24 may be partially etched to form first contact holes that expose an upper surface of the impurity region 22. The first contact holes may be filled with a metal material to form first contact plugs 26.

Then, a second insulation interlayer 28 may be formed on the first insulation interlayer 24. The first insulation interlayer 24 and the second insulation interlayer 28 may be partially etched to form second contact holes that expose an upper surface of the gate electrode 20. The second contact holes may be filled with a metal material to form a second contact plug 30, as illustrated in FIG. 2A.

The etching processes of forming the first and second holes and the deposition processes of forming the first and second plugs may be performed using plasma. Additionally, sequential metal wiring processes may also be performed using plasma. As mentioned above, the gate electrode 20 may be formed not to overlap the isolation layer pattern 14, to thereby prevent charging damage due to the generation of plasma.

Embodiment 2

Figure 8:
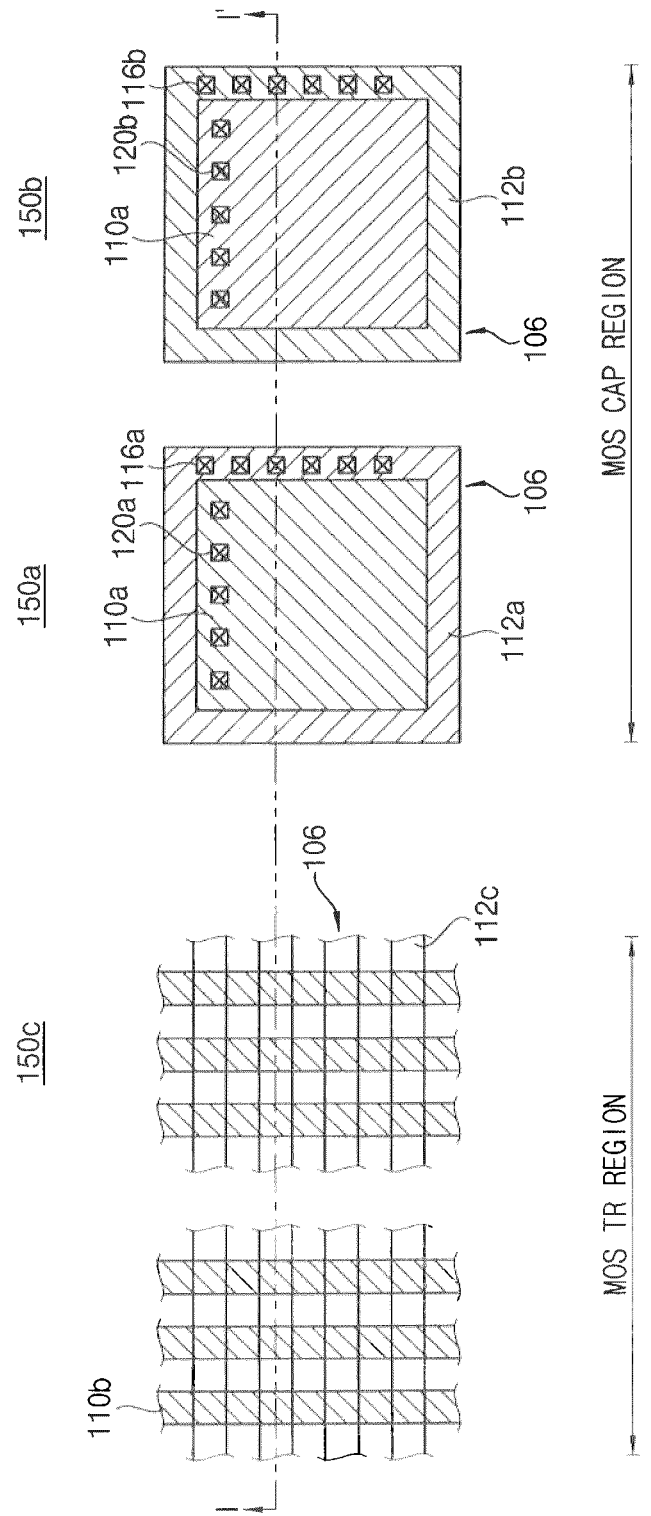
FIG. 8 is a plan view illustrating a semiconductor device in accordance with another example embodiment of the present general inventive concept.
Figure 9:
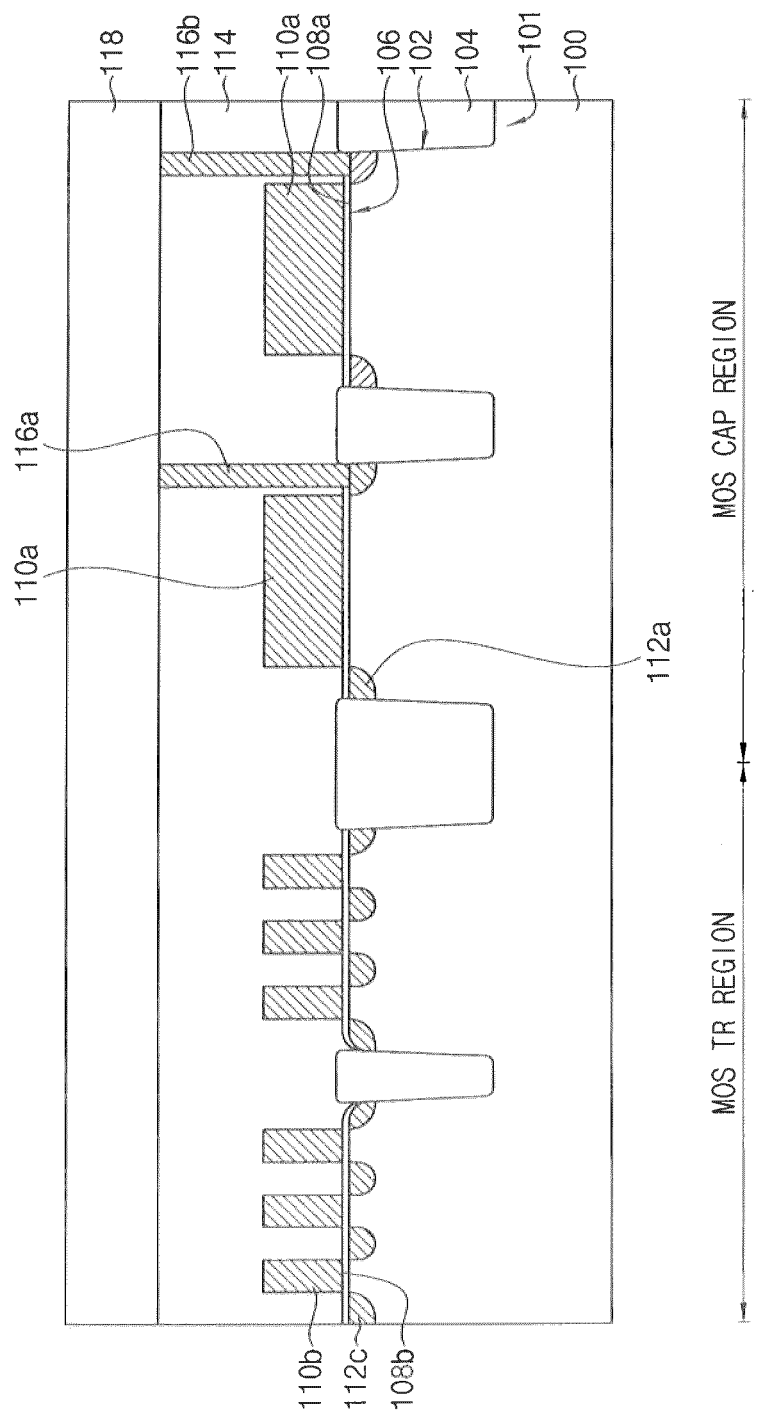
FIG. 9 is a cross-sectional view illustrating the semiconductor device in FIG. 8.

FIG. 8 is a plan view illustrating a semiconductor device in accordance with another example embodiment of the present general inventive concept, FIG. 9 is a cross-sectional view illustrating the semiconductor device illustrated in FIG. 8.

Referring to FIGS. 8 and 9, the semiconductor device may include a MOS transistor 150c and MOS capacitors 150a and 150b.

A substrate 100 may include a MOS transistor (MOS TR) region and a MOS capacitor (MOS CAP) region. An isolation trench 102 may be formed in a field region 101 of the substrate 100. An isolation layer pattern 104 may be formed in the isolation trench 102.

An N-type MOS capacitor 150a and a P-type MOS capacitor 150b may be provided in the MOS CAP region of the substrate 100.

The N-type capacitor 150a and the P-type capacitor 150b may each have a layout and a stacked structure substantially the same as those of the MOS capacitor 50 of FIG. 1. However, the N-type capacitor 150a may include a first impurity region 112a having N-type impurities and the P-type capacitor 150b may include a second impurity region 112b having P-type impurities.

A first gate electrode 110a of the N-type and P-type capacitors 150a, 150b may be formed within the boundary of an active region 106 and may not overlap the isolation layer pattern 104. The first impurity region 112a and the second impurity region 112b may each have an annular shape extending along the boundary of the first gate electrode 110a. A first gate insulation layer 108a of the N-type and P-type capacitors 150a and 150b, respectively, may have an equivalent oxide thickness of 50 Å to 200 Å.

The MOS transistor 150c may be provided in the MOS TR region of the substrate 100. The MOS transistor 150c may include a gate structure of a second gate insulation layer 108b and a second gate electrode 110b formed on the second gate insulation layer 108b, and a third impurity region 112c in both sides of the gate structure.

The second gate insulation layer 108b may include the same material as the first gate insulation layer 108a and may have the same thickness as the first gate insulation layer 108a. For example, the first and second gate insulation layer 108a, 108b may have an equivalent oxide thickness of 50 Å to 200 Å. The second gate electrode 110b may include a same material as the first gate electrode 110a and may have a same thickness as the first gate electrode 110a. The MOS transistor 150c may have a same operation voltage as the MOS capacitors 150a and 150b. For example, the MOS capacitors 150a and 150b may have an operation voltage of about 3V to 7V.

The second gate electrode 110b may have a linear shape extending across the active region 106. That is, the second gate electrode 110b may overlap the isolation layer pattern 104. The third impurity regions 112c may be separated by the second gate electrode 110b.

A line width of the second gate electrode 110b may be smaller than a line width of the first gate electrode 110a. For example, the second gate electrode 110b may have a line width of several micrometers (or several tens of micrometers). The line width of the second gate electrode 110b and the surface area of the upper surface of the second gate electrode 110b of the MOS transistor 150c may be relatively small as compared to the MOS capacitors 150a and 150b, respectively. Since the surface area of the second gate electrode 110b functioning as an antenna is relatively small, an electric field generated between the substrate 100 and the second gate electrode 110b during a plasma process may be relatively small. Accordingly, even though the second gate electrode 110b overlaps the isolation layer pattern 104, damage by plasma may be minimized.

The third impurity region 112c may be doped with N-type impurities or P-type impurities. Referring to FIG. 8, the third impurity region 112c may be doped with N-type impurities.

A first insulation interlayer 114 may be provided on the substrate 100 to cover the first gate electrode 110a and the second gate electrode 110b. The first insulation interlayer 114 may include silicon oxide.

First contact plugs 116a may be provided to penetrate the first insulation interlayer 114 to come in contact with the first impurity region 112a. Second contact plugs 116b may be provided to penetrate the first insulation interlayer 114 to make contact with the second impurity region 112b. The first and second contact plugs 116a and 116b may each include a barrier metal layer pattern and a metal layer pattern.

A second insulation interlayer 118 may be provided on the first insulation interlayer 114. Third contact plugs 120a may be provided to penetrate the second insulation interlayer 118 to make contact with the first gate electrode 110a. Fourth contact plugs 120b may be provided to penetrate the second insulation interlayer 118 to make contact with the second gate electrode 110b. The third and fourth plugs 120a and 120b may each include a barrier metal layer pattern and a metal layer pattern.

Although it is not illustrated, wirings may be provided to be electrically connected to the first and second contact plugs 116a and 116b, respectively, and wirings may be provided to be electrically connected to the third and fourth contact plugs 120a and 120b, respectively.

Figure 10:
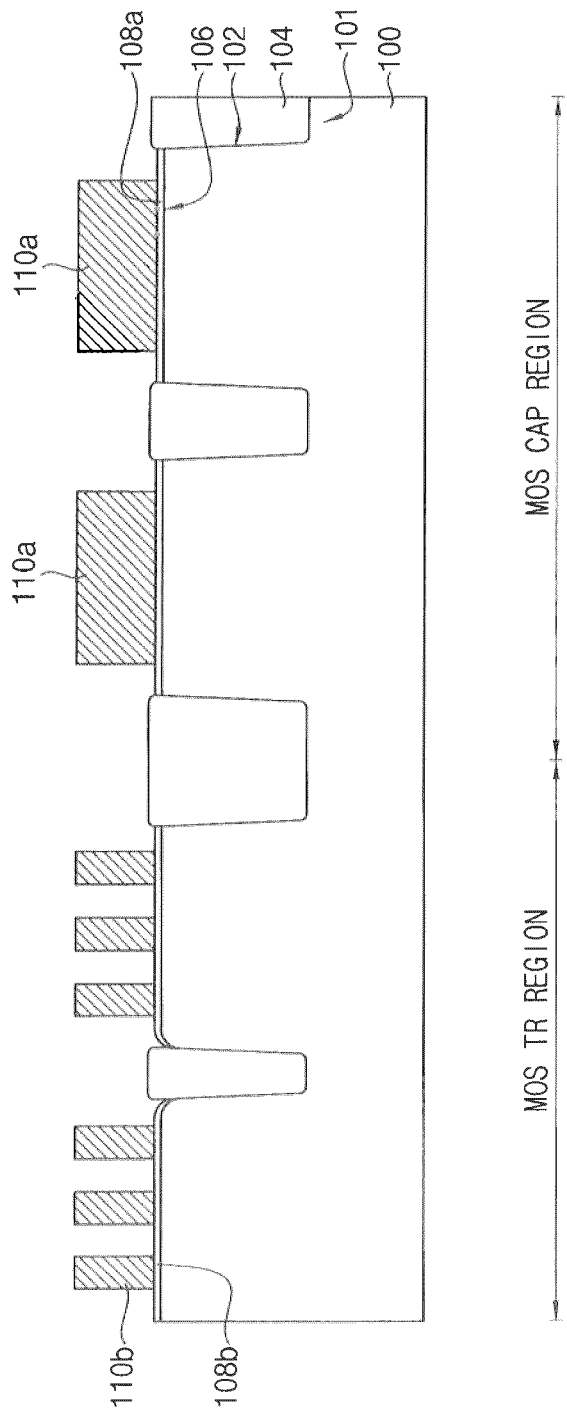
FIGS. 10 to 12 are cross-sectional views illustrating a method of manufacturing the semiconductor device in FIGS. 8 and 9.
Figure 11:
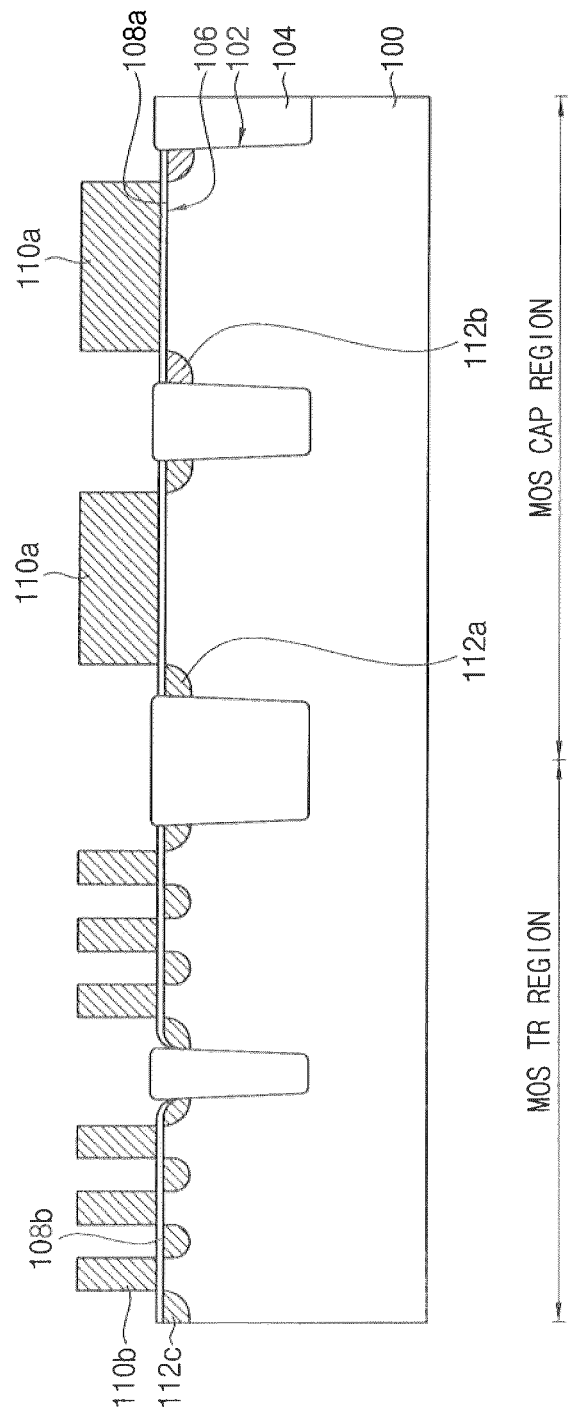
Figure 12:
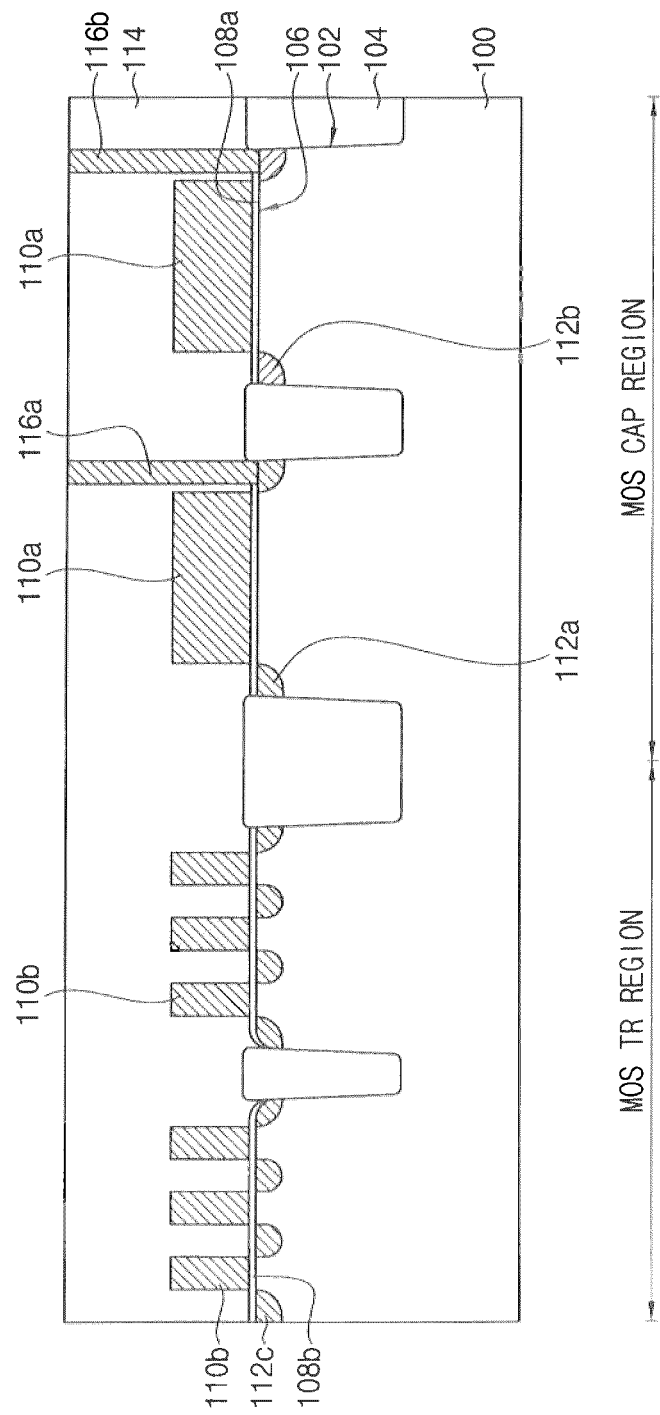

FIGS. 10 through 12 are cross-sectional views illustrating a method of manufacturing the semiconductor device illustrated in FIGS. 8 and 9.

Referring to FIG. 10, a field region 101 of a substrate 100 may be partially etched to form an isolation trench 102. The isolation trench 102 may be filled with an insulation material, such as silicon oxide, to form an isolation layer pattern 104.

First gate insulation layer 108a and second gate insulation layer 108b may be formed sequentially on the substrate 100. The first and second gate insulation layers 108a and 108b may each be formed using silicon oxide by a thermal oxidation process. The first and second gate insulation layers 108a and 108b may each be formed to have an equivalent oxide thickness of 50 Å to 200 Å.

A gate electrode layer may be formed on the first and second gate insulation layers 108a and 108b. A hard mask pattern may be formed on the gate electrode layer, and then, the gate electrode layer may be patterned using the hard mask pattern as an etching mask to form a first gate electrode 110a in the MOS CAP region and a second gate electrode 110b in the MOS TR region.

The first gate electrode 110a may be formed within boundaries of an active region 106. The first gate electrode 110a may be formed not to overlap the isolation layer pattern 104.

The second gate electrode 110b may be formed to have a linear shape extending across the active region 106. The second gate electrode 110b may overlap the isolation layer pattern 104.

Referring to FIG. 11, an ion implantation mask (not illustrated) may be formed on the PMOS capacitor region to expose the MOS transistor region and the NMOS capacitor region. Then, N-type impurities may be implanted into under a surface of the substrate 100 to form first and third impurity regions 112a and 112c, respectively. The first impurity regions 112a may have an annular shape extending along the boundary of the first gate electrode 110a.

Then, an ion implantation mask may be formed on the MOS transistor region and the NMOS capacitor region to expose the PMOS capacitor region. P-type impurities may be implanted into under a surface of the substrate 100 to form a second impurity region 112b. The second impurity region 112b may have an annular shape extend along the boundary of the first gate electrode 110a.

Referring to FIG. 12, a first insulation interlayer 114 may be formed on the substrate 100 to cover the first and second gate electrodes 110a, 110b. The first insulation interlayer 114 may be partially etched to form first and second contact holes that expose the first and second impurity regions 112a and 112b, respectively. The first and second contact holes may be filled with a metal material to form a first contact plug 116a and a second contact plug 116b.

Then, as illustrated in FIGS. 9 and 10, a second insulation interlayer 118 may be formed on the first insulation interlayer 114. The first insulation interlayer 114 and the second insulation interlayer may each be partially etched to form third and fourth contact holes that expose an upper surface of the first gate electrode 110a. The third and fourth contact holes may be filled with a metal material to form a third contact plug 120a and a fourth contact plug 120b.

Thus, damage by plasma may be prevented to manufacture a semiconductor device having a high reliability.

Embodiment 3

Figure 13:
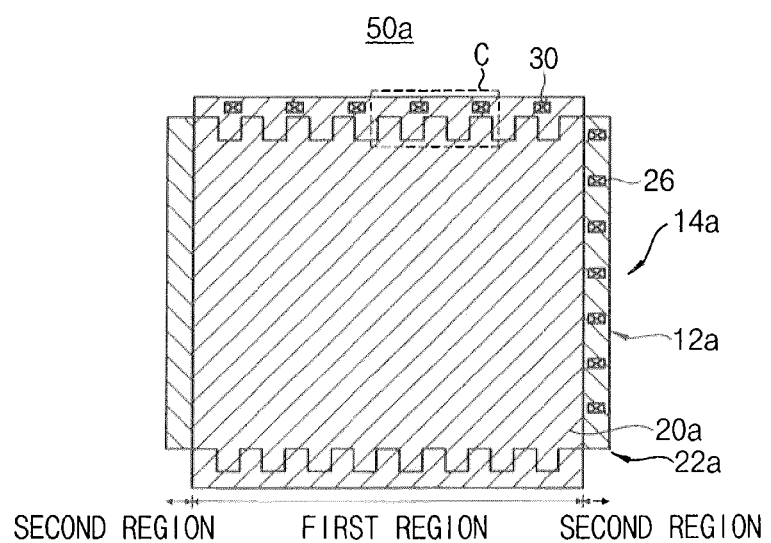
FIG. 13 is a plan view illustrating a MOS capacitor in accordance with yet another example embodiment of the present general inventive concept.
Figure 14:
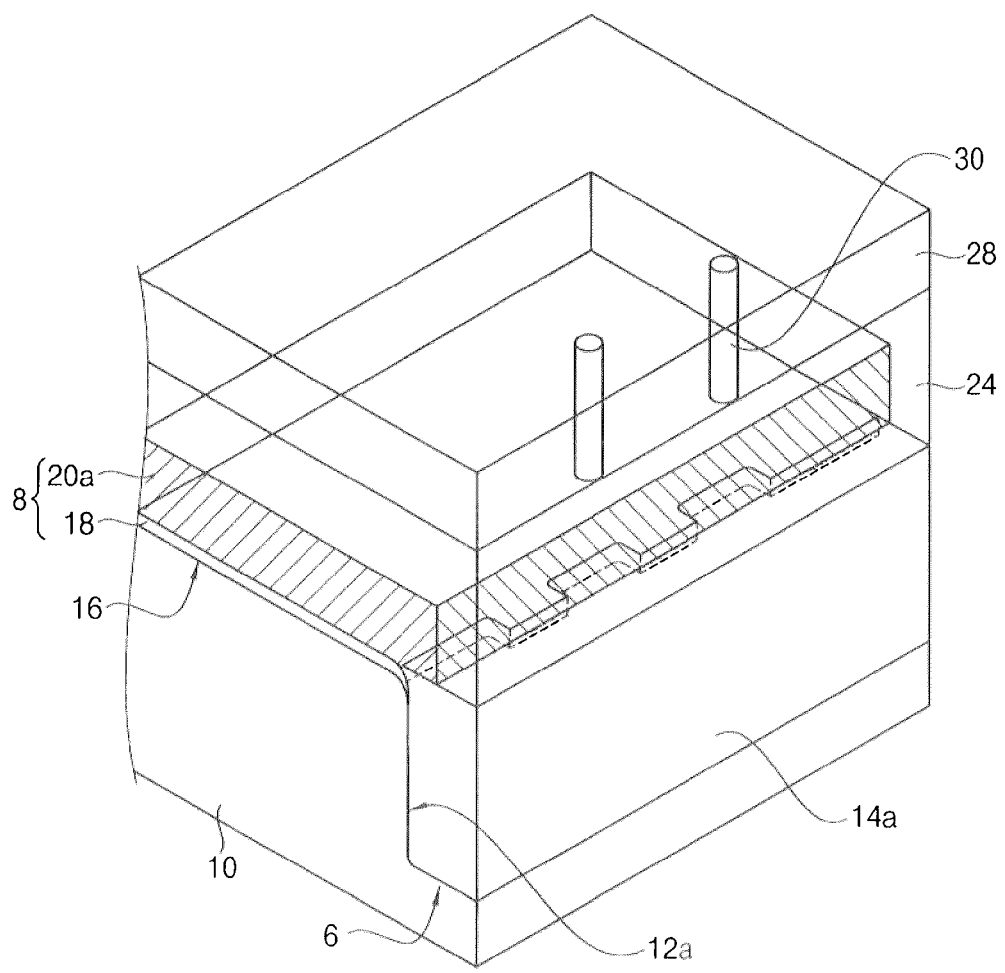
FIG. 14 is a perspective view illustrating a portion of the MOS capacitor in FIG. 13.

FIG. 13 is a plan view illustrating a MOS capacitor 50a in accordance with yet another example embodiment. FIG. 14 is a perspective view illustrating a portion of the MOS capacitor 50a illustrated in FIG. 13. FIG. 14 is an enlarged perspective view illustrating "C" portion in FIG. 13.

Referring to FIGS. 13 and 14, a MOS capacitor 50a may include a gate structure formed on a substrate 10, an impurity region 22a, a first insulation interlayer 24, a second insulation interlayer 28, and connection wirings 26 and 30.

The substrate 10 may include a semiconductor material such as single-crystalline silicon. The substrate 10 may include a field region 6 and an active region 16. An isolation trench 12a may be formed in the field region of the substrate 10. An isolation layer pattern 14a may be formed in an isolation trench 12a. The active region 16 may have an isolated shape.

A gate structure 8 may have a stacked structure of a gate insulation layer 18 and a gate electrode 20a. The gate electrode 20a may have a linear shape extending across the active region 16.

The active region 16 may have a first region and a second region. The first region of the active region 16 may overlap the gate electrode 20a. The second region of the active region 16 may be exposed by the gate electrode 20a, and may not overlap the gate electrode 20a. The second regions of the active region 16 may be provided on the substrate in both sides of the gate electrode 20a.

The boundary of the first region of the active region 16 may have a concave-convex shape. As illustrated in FIGS. 13 and 14, the boundary of the first region may have a concave portion and a convex portion that are arranged alternatively in correspondence with each other.

The boundary of the first region having a concave-convex shape may have a relatively longer distance compared to the boundary of the active region 16 having a linear shape. The boundary of the first region may face the boundary of the isolation layer pattern 14a. Accordingly, the distance of the boundary of the isolation layer pattern 14a overlapping the gate electrode 20a may be relatively increased.

The gate insulation layer 18 may include silicon oxide. The gate insulation layer 18 may have an equivalent oxide thickness of 50 Å to 200 Å. The MOS capacitor 50a may have an operation voltage of about 3V to 7V. As explained in the embodiment of FIG. 1, the gate insulation layer 20a may have a relatively smaller thickness on a portion of the active region 16 adjacent to the isolation layer pattern 14a.

The gate electrode 20a may be provided on the gate insulation layer 18 to extend across the active region 16 to the boundary of the isolation layer pattern 14a. As mentioned above, since the boundary of the first region of the active region 16 has a concave-convex shape, the distance of the boundary of the isolation layer pattern 14a overlapping the gate electrode 20a may be relatively increased.

Referring to FIGS. 13 and 14, the overlapped portion between the gate electrode 20a and the isolation layer pattern 14a may be relatively increased, to prevent charging damage due to effects of a high density plasma process. Hereinafter, advantages of the present embodiment will be explained in detail.

The impurity region 22a may be provided under a surface of the active region 16 exposed by the gate electrode 20a. According to a conductive type of the MOS capacitor 50a, the impurity region 22a may be doped with N-type impurities or P-type impurities.

The first insulation interlayer 24 may be provided on the substrate 10 to cover the gate electrode 20a. The first insulation interlayer 24 may include silicon oxide.

The connection wirings 26 and 30 may include a first contact plug 26 and a second contact plug 30. The first contact plugs 26 may penetrate the first insulation interlayer 24 to make contact with the impurity region 22a. The second contact plugs 30 may penetrate the second and first insulation interlayers 28 and 24 to make contact with the gate electrode 20a.

Although it is not illustrated, a first wiring line may be provided to be electrically connected to the first contact plug 26. A second wiring line may be provided to be electrically connected to the second contact plug.

As explained in the embodiment of FIG. 1, an electric field may be focused on the boundary regions between the gate electrode 20a and the isolation layer pattern 14a. Accordingly, the boundary regions overlapped between the gate electrode 20a and isolation layer pattern 14a may be possibly damaged more severely than other portions by plasma.

Referring to FIGS. 13 and 14, the overlapped portion between the gate electrode 20a and the isolation layer pattern 14a may have a relatively long distance. Therefore, an electric field may be distributed uniformly over the overlapped portion between the gate electrode 20a and the isolation layer pattern 14a, not focused on any specific region. Accordingly, a strong electric field may be prevented from being generated and focused on the boundary region of the gate electrode 20a during a plasma process.

Figure 15:
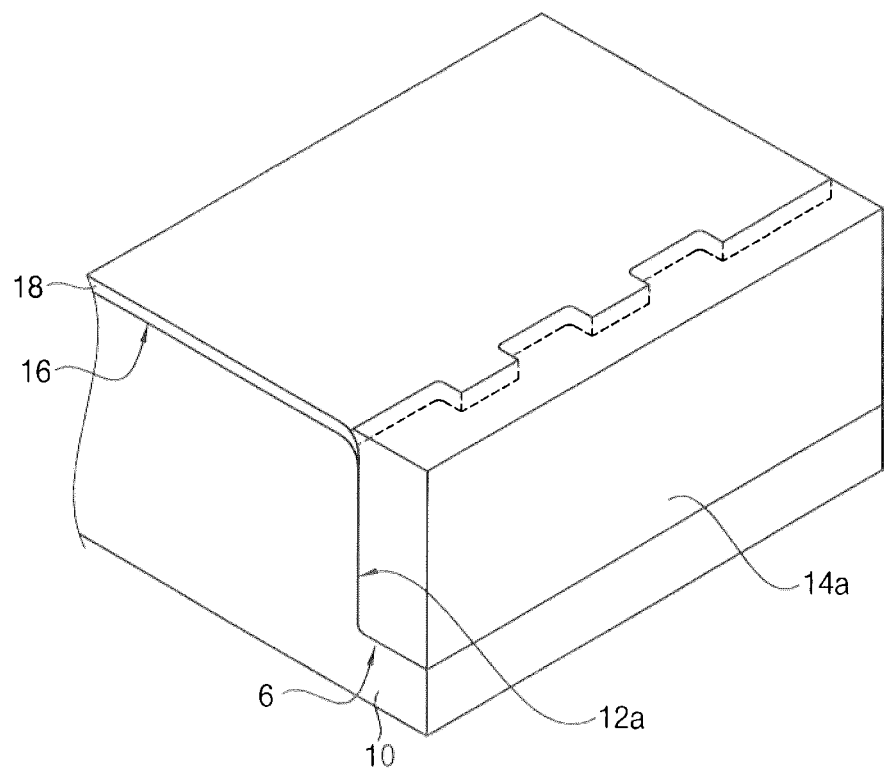
FIGS. 15 and 16 are perspective views illustrating a method of manufacturing the MOS capacitor in FIGS. 13 and 14.
Figure 16:
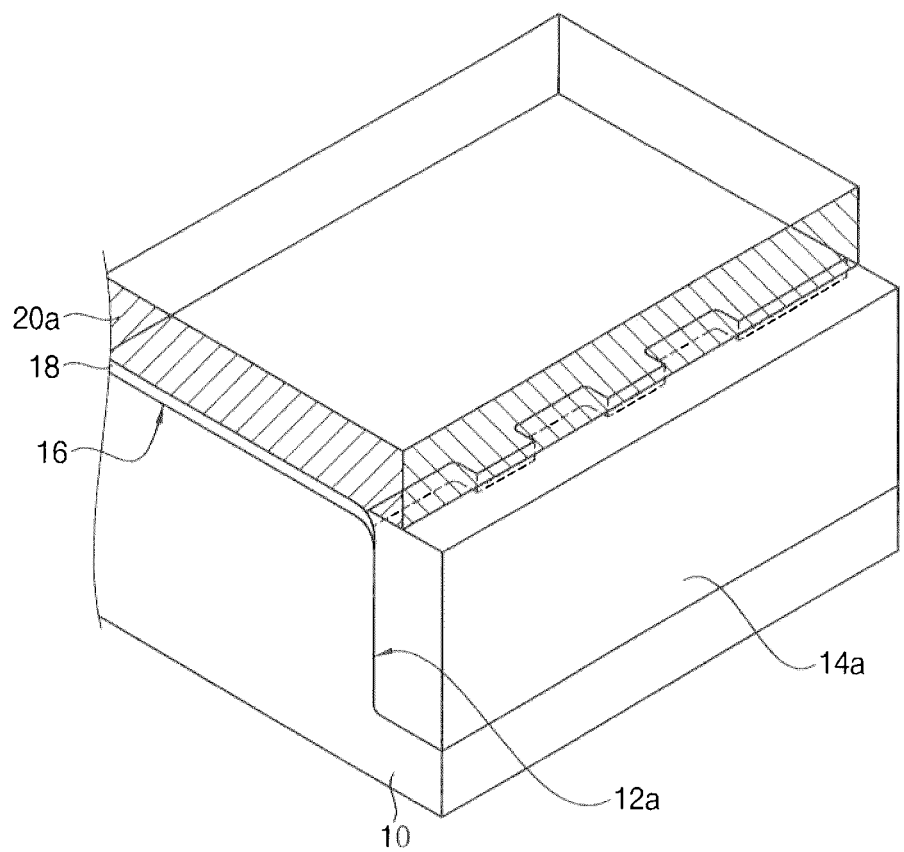

FIGS. 15 and 16 are perspective views illustrating a method of manufacturing the MOS capacitor 50a illustrated in FIGS. 13 and 14.

Referring to FIG. 15, a field region 6 of a substrate 10 may be partially etched to form an isolation trench 12a.

As illustrated in FIG. 15, the boundary of the isolation trench 12a may be formed to have a concave-convex shape. That is, the boundary of the isolation trench 12a may have a concave portion and a convex portion arranged alternatively with correspondence to each other.

The isolation trench 12a may be filled with an insulation material including silicon oxide to form an isolation layer pattern 14a.

A gate insulation layer 18 may be formed on an active region 16 of the substrate 10.

Referring to FIG. 10, a gate electrode layer (not illustrated) may be formed on the gate insulation layer 18. A hard mask pattern (not illustrated) may be formed on the gate electrode layer, and then, the gate electrode layer may be patterned using the hard mask pattern as an etching mask to form a gate electrode 20a.

The gate electrode 20a may be formed to extend across the active region 16. The gate electrode 20a may be formed to be overlapped with the boundary of the isolation layer pattern 14a having the concave-convex shape.

Processes the same as or similar to those explained with reference to FIGS. 5 and 6 may be performed to form the MOS capacitor 50a in FIGS. 13 and 14.

According to the above-mentioned processes, an electric field may be prevented from being focused on the boundary region of the gate electrode 20a during a plasma process, to thereby manufacture a semiconductor device having a high reliability.

Embodiment 4

Figure 17:
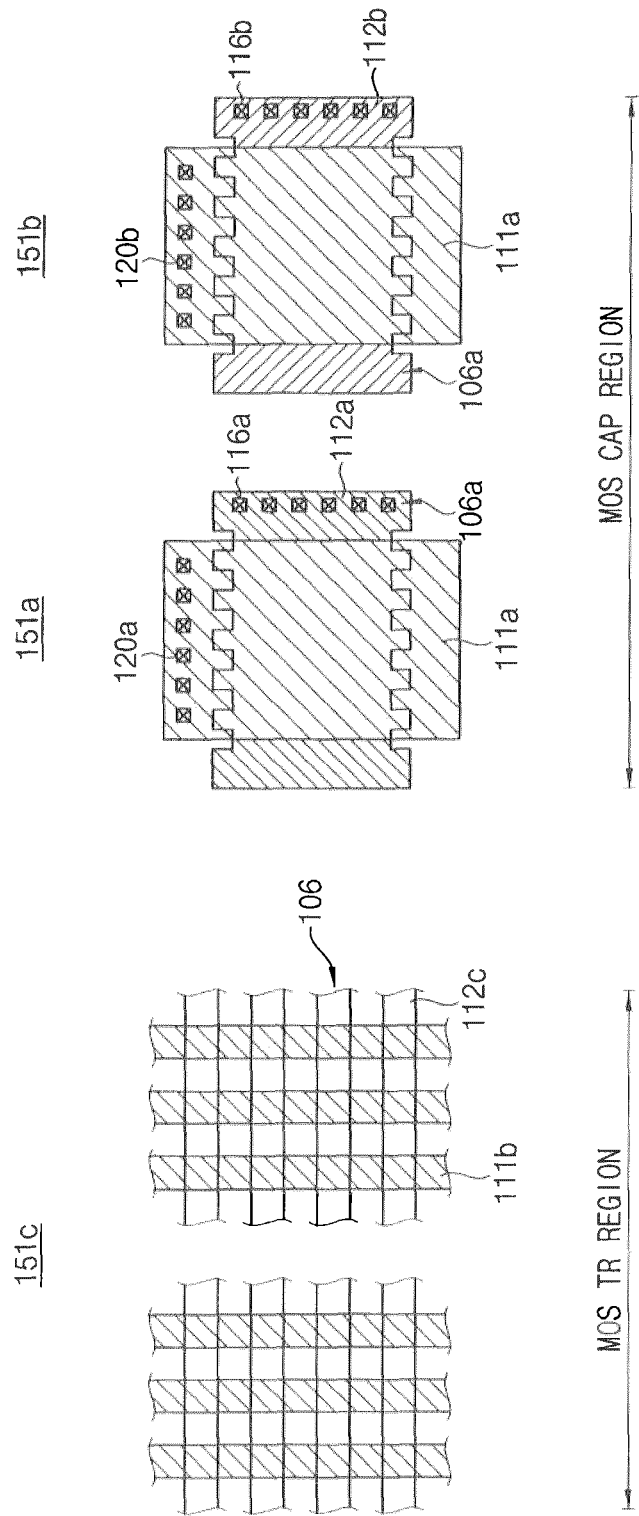
FIG. 17 is a plan view illustrating a semiconductor device in accordance with another example embodiment of the present general inventive concept.

FIG. 17 is a plan view illustrating a semiconductor device in accordance with another example embodiment.

The semiconductor device of FIG. 17 is substantially the same as the embodiment as illustrated in FIG. 8, except for slight variations in a MOS capacitor.

Referring to FIG. 17, a semiconductor device may include a MOS transistor 151c in a MOS TR region, a NMOS capacitor 151a in a MOS CAP region and a PMOS capacitor 151b in the MOS CAP region.

Figure 18:
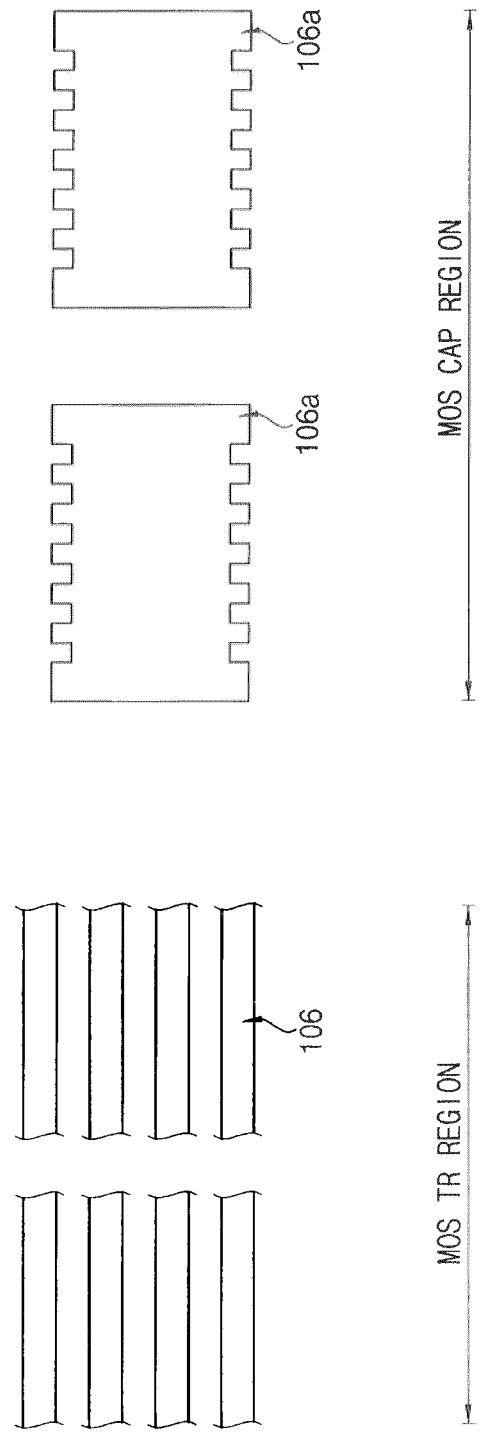
FIGS. 18 and 19 are plan views illustrating a method of manufacturing the semiconductor device in FIGS. 16 and 17.
Figure 19:
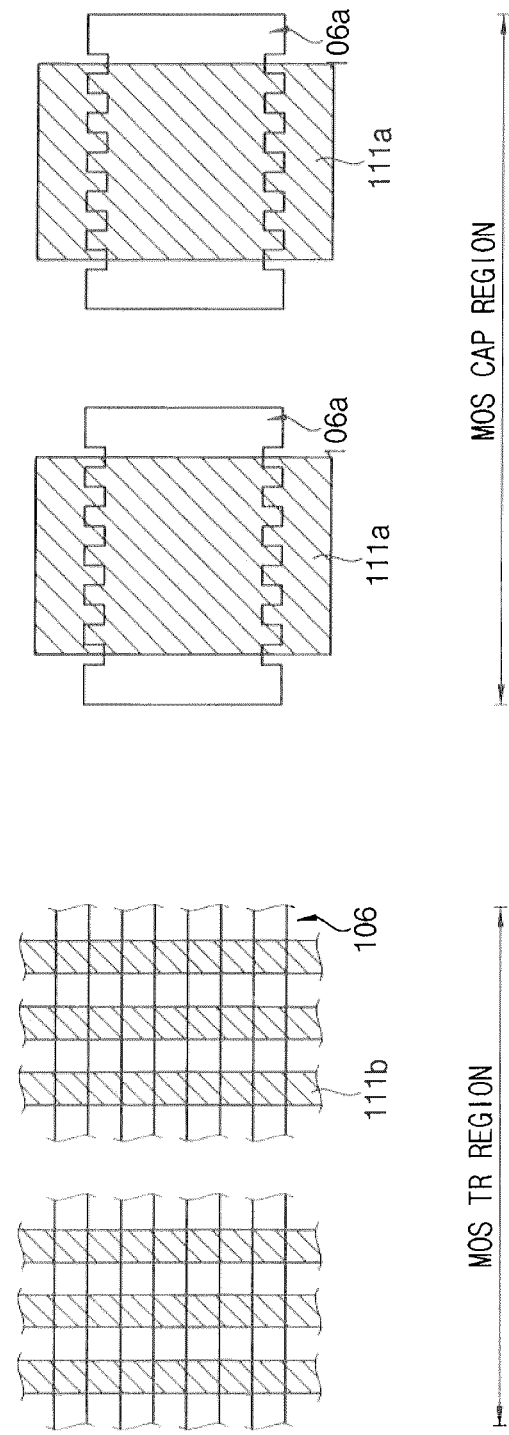

FIGS. 18 and 19 are plan views illustrating a method of manufacturing the semiconductor device in FIGS. 16 and 17.

Referring to FIG. 18, a field region of a substrate may be partially etched to form an isolation trench. The isolation trench may be formed such that boundaries of a corresponding active region 106a of a NMOS capacitor and a PMOS capacitor each have a concave-convex shape. The isolation trench may be filled with an insulation material including silicon oxide to form an isolation layer pattern.

Referring to FIG. 19, a gate insulation layer may be formed on the substrate. A gate electrode layer may be formed on the gate insulation layer.

A hard mask pattern may be formed on the gate electrode layer, and then, the gate electrode layer may be patterned using the hard mask pattern as an etching mask to form a first gate electrode 111a in the MOS capacitor region and a second gate electrode 111b in the MOS transistor region.

The first gate electrode 111a may be formed to extend across the active region. The gate electrode 111a may be formed to be overlapped with the boundary of the isolation layer pattern having the concave-convex shape.

Processes the same as or similar to those explained with reference to FIGS. 11 and 12 may be performed on the substrate of FIGS. 17 through 19. That is, impurities may be implanted into the substrate in both sides of the first gate electrode 111a and the second gate electrode 111b to form first, second and third impurity regions 112a, 112b, and 112c, respectively. Following processes may be performed to form an insulation interlayer that covers the first gate electrode 111a, the second gate electrode 111b, the contact plug 120a, and the contact plug 120b, that penetrate the insulation interlayer. Thus, the semiconductor device in FIG. 17 may be formed on the substrate.

According to the above-mentioned processes, an electric field may be prevented from being focused on the boundary region of the first gate electrode 111a and the second gate electrode 111b during a plasma process, to thereby manufacture a semiconductor device having a high reliability.

Figure 20:
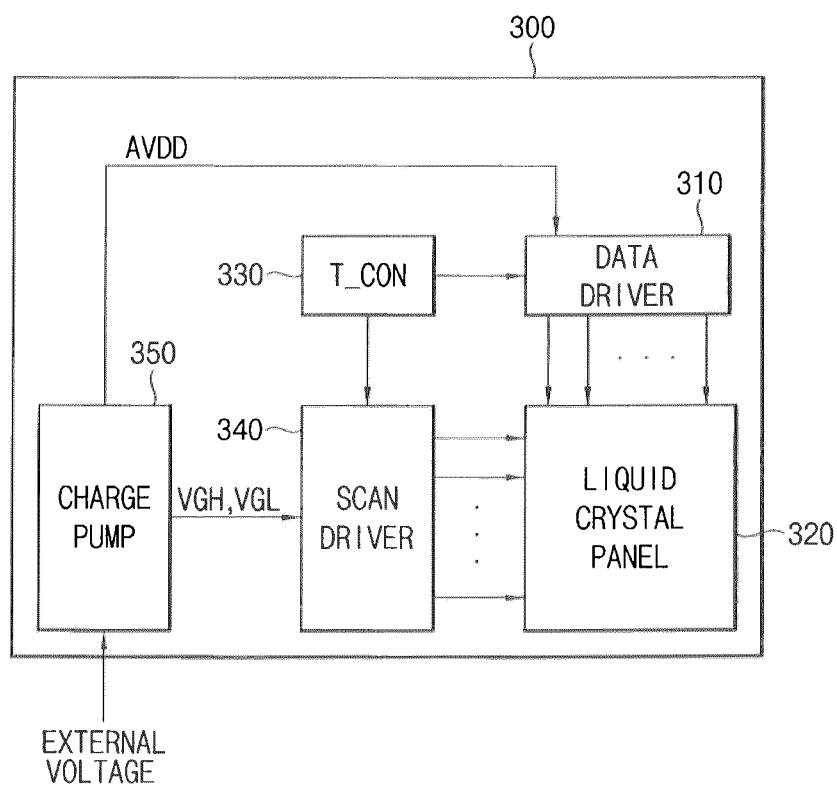
FIG. 20 is a block diagram illustrating a display driving system including the MOS capacitor in accordance with an example embodiment of the present general inventive concept.

The MOS capacitor according to an example embodiment of the present general inventive concept may be applied to a mobile display driving system. FIG. 20 is a block diagram illustrating a display driving system including the MOS capacitor in accordance with an example embodiment of the present general inventive concept.

Referring to FIG. 20, a display driving system 300 may include a timing controller (T_CON) 330, a scan driver 340, a data driver 310, a liquid crystal panel 320 and a charge pump 350. The timing controller 330 may generate a control signal to control the scan driver 340 and the data driver 310, and may receive an external image signal and transmit the image signal to the data driver 310.

Examples of voltages required to drive a liquid crystal diode (LCD) may include a boosted voltage such as a source line driving voltage (AVDD) and a gate line high voltage (VGH) having a positive voltage higher than an external input voltage, a gate line low voltage (VGL) having a negative voltage smaller than a ground voltage (GND), etc., but are not limited thereto. The charge pump 350 may generate and provide a positively increased AVDD and VGH, and a negatively increased VGL to the scan driver 340 and the data driver 310. The charge pump may include pumping capacitors to boost the input voltage. The pumping capacitor may be a MOS capacitor according to an example embodiment of the present general inventive concept.

The data driver 310 may receive AVDD from the charge pump 350 and supply a grey-scale voltage corresponding to the received image signal.

The scan driver 340 may receive VGH and VGL from the charge pump 340 to use an on-off voltage corresponding to thin film transistors.

As mentioned above, various semiconductor devices may include a MOS capacitor according to example embodiments. For example, the MOS capacitor according to example embodiments may be used in a mobile display driving IC (DDi). The mobile display driving IC may be applied to a mobile phone, a portable multimedia player (PMP), navigation device (e.g., a global positioning service), an ultra mobile PC (UMPC), etc., but is not limited thereto.

According to example embodiments of the present general inventive concept, a gate electrode of a semiconductor device may be arranged within a boundary of an active region of a substrate to cover a middle region of the active region. Accordingly, the gate electrode may not overlap a boundary of an isolation layer pattern, to thereby prevent a strong electric field from being focused on the boundary region of the isolation layer pattern during a plasma process. Thus, damage by plasma may be prevented during manufacture of a semiconductor device having a high reliability.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents,

What is claimed is:

1. A semiconductor device, comprising:
   a substrate comprising an isolated active region having and a field region;
   a gate insulation layer provided on an entire upper surface of the active region of the substrate;
   a gate electrode provided on the gate insulation layer and spaced apart from a boundary of the active region to cover a middle portion of the active region, the gate electrode not overlapping the field region; and
   an impurity region provided under a surface of the active region that is exposed by the gate electrode such that the gate electrode does not extend to the field region.

2. The semiconductor device of claim 1, wherein the impurity region has an annular shape extending along the boundary of the gate electrode.

3. The semiconductor device of claim 1, wherein the semiconductor device is used as a MOS capacitor.

4. The semiconductor device of claim 3, wherein the MOS capacitor has an operation voltage of 3V to 7V.

5. The semiconductor device of claim 1, wherein the gate insulation layer has an equivalent oxide thickness of 50 Å to 200 Å.

6. The semiconductor device of claim 1, wherein an isolation trench is provided in the field region of the substrate and an isolation layer pattern is provided within the isolation trench.

7. The semiconductor device of claim 1, wherein the upper surface of the active region comprises a first portion having a flat surface and a second portion having an angle of inclination in the boundary region adjacent to the field region.

8. The semiconductor device of claim 1, wherein the gate insulation layer has a relatively smaller thickness on the second portion of the active region than on the first portion of the active region.

9. The semiconductor device of claim 1, further comprising an insulation interlayer provided on the substrate to cover the gate electrode;
   first contact plugs penetrating the insulation interlayer to make contact with the impurity region; and
   second contact plugs electrically connected to the gate electrode.

10. The semiconductor device of claim 9, wherein the first and second contact plugs comprises a metal material.

11. The semiconductor device of claim 1, further comprising MOS transistors in another region of the substrate, wherein the MOS transistor comprises a second gate insulation layer, a second gate electrode having a line width smaller than that of the gate electrode and extending across the active region and a second impurity region provided under a surface of the active region in both sides of the second gate electrode.

12. The semiconductor device of claim 1, wherein the gate electrode is spaced apart from the boundary of the active region by 20 nm or more.

13. A semiconductor device, comprising:
    a substrate including an active region and a field region;
    a gate electrode formed over a center portion of the active region such that the gate electrode does not extend to the field region;
    an impurity region formed in the active region at portions exposed by the gate electrode; and
    a gate insulation layer formed between the gate electrode and the active region to cover an entire upper surface of the active region and an entire upper surface of the impurity region.

14. The semiconductor device of claim 13, wherein respective end portions of the gate insulation layer extend to respective outer portions of the impurity region.

15. The semiconductor device of claim 13, wherein the gate insulation layer comprises:
    a middle portion of uniform thickness; and
    a plurality of end portions having a decreasing thickness with respect to the middle portion.

16. The semiconductor device of claim 15, wherein an upper surface of the active region comprises a first portion having a flat surface corresponding to the middle portion of the gate insulation layer and a second portion having an angle of inclination corresponding to the end portion of the gate insulation layer.

17. A semiconductor device, comprising:
    a substrate comprising a plurality of active regions each within isolation trenches; and
    a capacitor region, comprising:
      a first impurity region adjacent to a first of the plurality of active regions,
      a first gate insulation layer disposed on an upper surface of the first of the plurality of active regions and the first impurity region, and
      a first gate electrode disposed on an upper surface of the first gate insulation layer and within a center portion of the first of the plurality of active regions such that the first gate electrode does not extend to the isolation trenches.

18. The semiconductor device of claim 17, further comprising:
    a transistor region, comprising:
      a second impurity region adjacent to a second of the plurality of active regions,
      a second gate insulation layer disposed on an upper surface of the second of the plurality of active regions and the second impurity region, and
      a second gate electrode disposed on an upper surface of the second gate insulation layer and within a center portion of the second of the plurality of active regions.

19. The semiconductor device of claim 18, wherein the capacitor region further comprises:
    a third impurity region adjacent to a third of the plurality of active regions;
    a third gate insulation layer disposed on an upper surface of the third of the plurality of active regions and the third impurity region; and
    another first gate electrode disposed on the upper surface of the third gate insulation layer and within a center portion of the third of the plurality of active regions.

20. The semiconductor device of claim 19, wherein the first impurity region is N-type doped and the third impurity region is P-type doped.

\* \* \* \* \*

UNITED STATES PATENT AND TRADEMARK OFFICE
CERTIFICATE OF CORRECTION

PATENT NO.        : 8,907,391 B2                                        Page 1 of 1
APPLICATION NO.   : 13/614654
DATED             : December 9, 2014
INVENTOR(S)       : Jung-Soo Nam et al.

It is certified that error appears in the above-identified patent and that said Letters Patent is hereby corrected as shown below:

On the Title Page

Insert Item --(30) Foreign Application Priority Data: December 22, 2011
(KR)......... 10-2011-0140228--

Signed and Sealed this
Twenty-fourth Day of March, 2015

Michelle K. Lee
*Director of the United States Patent and Trademark Office*